(12) United States Patent
Rosenthal et al.

(10) Patent No.: US 10,879,584 B2
(45) Date of Patent: Dec. 29, 2020

(54) METHODS AND APPARATUS FOR IMPLEMENTING AN ACCESS POINT SUPPORTING MULTIPLE COMMUNICATIONS PROTOCOLS

(71) Applicant: Mist Systems, Inc., Cupertino, CA (US)

(72) Inventors: Josh Rosenthal, San Jose, CA (US); John Musante, Holtsville, NY (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/403,544

(22) Filed: May 4, 2019

(65) Prior Publication Data

US 2019/0341674 A1 Nov. 7, 2019

Related U.S. Application Data

(60) Provisional application No. 62/667,315, filed on May 4, 2018.

(51) Int. Cl.
| | |
|---|---|
| *H01Q 1/22* | (2006.01) |
| *H04W 88/08* | (2009.01) |
| *H01Q 3/08* | (2006.01) |
| *H04W 4/80* | (2018.01) |
| *H05K 5/06* | (2006.01) |
| *H05K 7/20* | (2006.01) |
| *H05K 5/02* | (2006.01) |
| *H04W 80/08* | (2009.01) |
| *H04W 84/12* | (2009.01) |

(52) U.S. Cl.
CPC ............ *H01Q 1/2291* (2013.01); *H01Q 3/08* (2013.01); *H04W 4/80* (2018.02); *H04W 88/08* (2013.01); *H05K 5/0204* (2013.01); *H05K 5/061* (2013.01); *H05K 7/20154* (2013.01); *H04W 80/085* (2013.01); *H04W 84/12* (2013.01)

(58) Field of Classification Search
CPC ....................... H01R 13/6691; H01R 2107/00; H01R 24/64; H04B 5/0062; H04L 12/10; H04L 41/0803; H04L 49/351
See application file for complete search history.

(56) References Cited

U.S. PATENT DOCUMENTS

| | | | |
|---|---|---|---|
| 2005/0144237 A1* | 6/2005 | Heredia | H04W 12/0602 709/206 |
| 2006/0082973 A1* | 4/2006 | Egbert | H05K 7/20154 361/709 |
| 2009/0158802 A1* | 6/2009 | Guo | B21B 31/32 72/242.4 |

* cited by examiner

*Primary Examiner* — Monica C King
(74) *Attorney, Agent, or Firm* — Schwegman Lundberg & Woessner, P.A.

(57) ABSTRACT

Access points which can be mounted in a variety of locations or orientations and can support multiple communications protocols are described. The access point includes a main housing, e.g., main body, and a front housing connected together by a hinge. A Wi-Fi antenna is included in the front housing in some embodiments. The access point can be used in an open or closed position. When mounted in a vertical position the front housing can be lowered into a horizontal position facilitating preferred antenna orientation. A first set of cooling fins serves to keep the internal components of the access point off a wall when the access point is wall mounted facilitating air flow. Additional fins act as a spacer between the main housing and the front housing when the access point is used in a closed position facilitating air flow around both sides of the main housing.

18 Claims, 12 Drawing Sheets

METHODS AND APPARATUS FOR IMPLEMENTING AN ACCESS POINT SUPPORTING MULTIPLE COMMUNICATIONS PROTOCOLS

RELATED APPLICATIONS

The present application claims the benefit of U.S. Provisional Patent Application Ser. No. 62/667,315 filed May 4, 2018 which is hereby expressly incorporated by reference in its entirety.

FIELD

The present application is directed to access point methods and apparatus and, more particularly, to access points which can be mounted in a variety of locations and orientations and which can support multiple communications protocols, e.g., Bluetooth and/or Wi-Fi.

BACKGROUND

Access points which often have flat backs to allow for mounting to a wall. Such devices can be subject to overheating issues with limited opportunity for air cooling due to the flat mounting to the wall.

While some antennas can work well while mounted vertically, in the case of a Bluetooth Low Energy (BLE) antenna array intended to transmit to devices below the access point a horizontal orientation of the array can be desirable from a radio transmission coverage area perspective.

While it would be desirable to allow for vertical mounting of an access point to a wall or pole, it would also be desirable if it were possible to have a BLE antenna array in the horizontal position for access points which are likely to be mounted above devices which are likely to communicate to the access point.

In view of the above there is a need for new access points which address one or more of the cooling and/or antenna array positioning issues discussed above.

SUMMARY

An Access Point in some embodiments includes a housing, e.g., a waterproof main housing with cooling fins and a front housing which includes one or more antennas. A hinge allows movement of the front housing so that it can be positioned in a vertical position against the main housing in a horizontal position, e.g., parallel to the ground at 90 degrees to the vertically oriented main housing.

Indoor embodiments can use the same or similar housing but it need not be waterproof in the case of indoor applications. A Wi-Fi antenna may be and sometimes are attached through connectors on the main housing. The main housing and/or WiFi antenna can be mounted to a pole or wall. Alternatively an internal Wi-Fi antenna included in the front portion of the housing in at least some but not necessarily all embodiments can be, and sometimes is, used to support Bluetooth and/or Wi-Fi. In some embodiments a Bluetooth antenna assembly, e.g., a BLE array, is included in a moveable front housing with one or more LED status indicators being mounted in the front housing and visible from the outside of the front housing. The LED status indicator(s) can and sometimes do indicate that the access point is active, e.g., powered on. Flashing of the indicator can be used to communicate various status conditions. While one LED indicator is included in various exemplary embodiments, additional indicator lights may be and sometimes are included and used to communicate particular status information such as Wi-Fi status active, Bluetooth status active, in addition to general power on which may be and sometimes is indicated by a third LED. The front housing assembly is secured to the main housing by a hinge. The hinge in some embodiments is located at the bottom of the main and front housings. Power and data connections are provided via a secure waterproof cable connection, e.g., passing through a watertight tube between the main and front housings, to allow the components in the main and front housings to interact. The access point can be wall or pole mounted.

The main front housing, which includes the Bluetooth antenna assembly, includes one or more antenna elements used to transmit and/or receive Bluetooth signals, e.g., BLE signals, and can be used in a vertical or horizontal position. The position of the front housing is detected and reported to a processor in the access point and, optionally, one or more devices coupled to the access point by an interface and/or Wi-Fi signals. The position is detected by a sensor or sensor array located in the front housing. The sensors may and sometimes do include one or more accelerometers. The detected position of the Bluetooth and/or included Wi-Fi antenna is known from the reported housing position information, e.g., relative to the ground, with the positions being detected by sensors in the access point and communicated to one or more devices which use the access point or process measurements of signals received from the access point. Thus the position information which allows for the Bluetooth and/or Wi-Fi antenna position, e.g., vertical, horizontal or at some angle relative to horizontal, being useful in facilitating position determinations made from signals received from the access point since the RF coverage/path loss for signals transmitted by the access point can be estimated by taking into consideration the position of the antenna(s) relative to the ground. The position of cooling fins between the front and main housing portions allows air to pass through the device and cool both the main and front assemblies.

Water tight connectors allow for the supply of power and antenna connections. Cooling fins on the back of the main housing which may be secured against a wall allow for air to pass between the wall and main access point housing even when secured directly to a wall. Thus air can flow around each side of the main and front housing in both wall and poll deployments since the arrangement of cooling fins allow for air flow between and behind the front and main housings and behind the main body housing. Air can also pass along the front of the front body since it is normally exposed in either the open or closed positions access point modes of operation. A pressure vent is included to allow venting in the case of pressure build up, e.g., due to heating, without letting water in. The Bluetooth antenna can be used in the vertical or horizontal front assembly positions with knowledge of the position being known from the position sensor(s) allowing the orientation of the Bluetooth front assembly and antenna to be taken into consideration when making coverage and/or Bluetooth coverage area predictions which can be used, e.g., to facilitate location determination. Access Point—supporting Wifi, e.g., In some embodiments the access points supports 802.11 and Bluetooth, e.g., Bluetooth Low Energy (BLE) communications protocols and wireless signals.

Numerous features and embodiments are described in the detailed description which follows.

DETAILED DESCRIPTION

Various embodiments are directed to an access point which can receive and transmit wireless signals, e.g., Bluetooth and/or Wi-Fi signals. The access point in an outdoor embodiment is waterproof. The indoor embodiment need not be and sometimes is not water proof.

Figure 1:
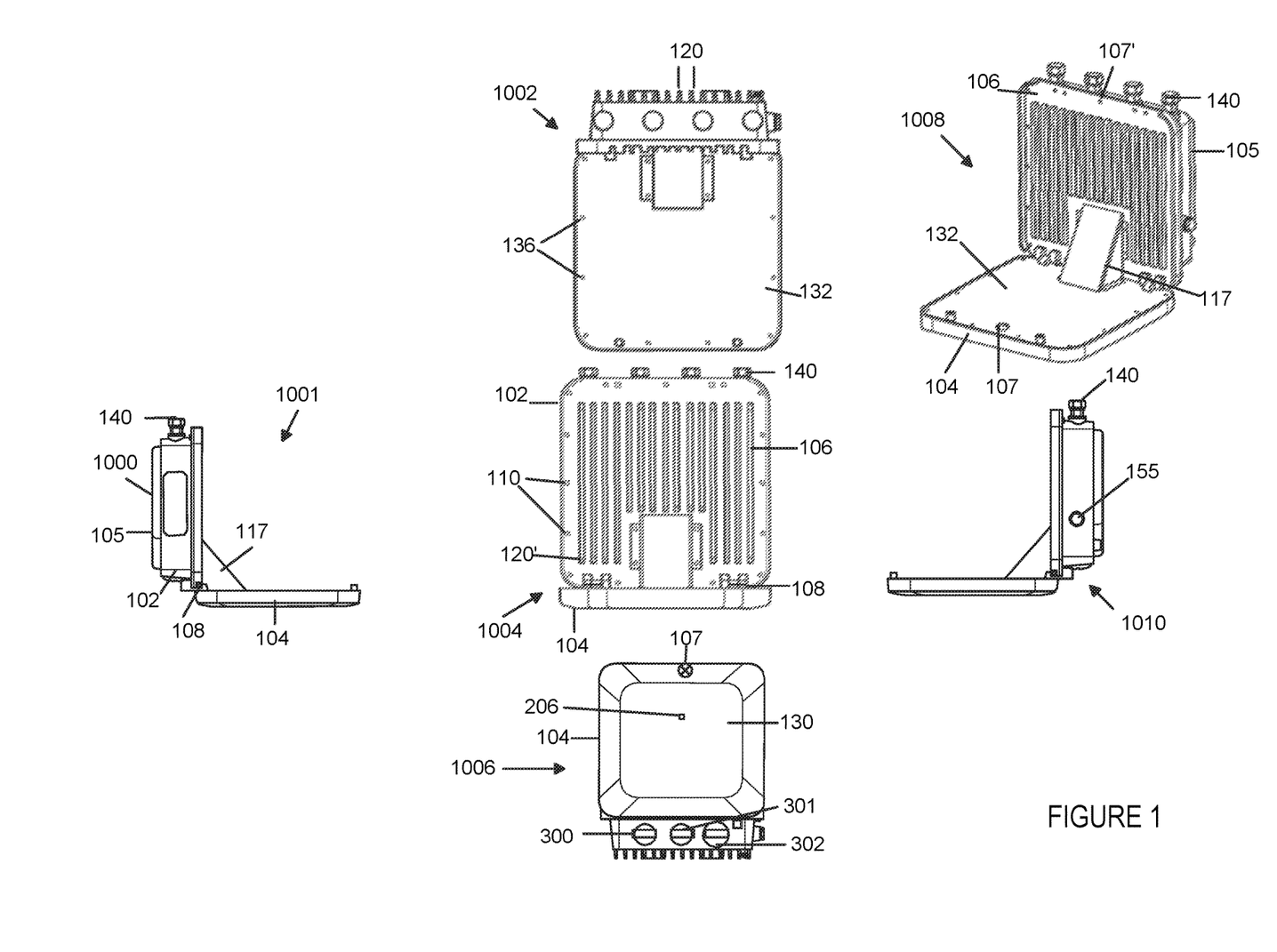
FIG. 1 is a set of diagrams showing various perspectives of an exemplary access point implemented in accordance with one embodiment of the invention that includes a hinge connecting a main housing and a front housing thereby allowing the front housing portion to be deployed in a horizontal position even when the main housing is mounted to a pole or wall.

FIG. 1 shows various views, 1001, 1002, 1004, 1006, 1008 and 1010 of an access point 1000. Other figures show the same access point or a similar access point. It should be appreciated that features shown in the different illustrated embodiments shown in different figures can be used together in a single access point. Accordingly, while the exemplary access points shown in different figures may have some different features, the features may be combined and used together. Given the commonality between the various illustrated access points shown in the various figures of the application, reference numbers which are the same in different figures are used to refer to the same or a similar component. Accordingly once an element shown in one figure, and identified by a reference number, is discussed and explained, the element identified using the same reference number in a later figure may not be discussed again with regard to the later figure for the sake of brevity.

FIG. 1 shows an embodiment of an access point 1000 that supports Wi-Fi, e.g., 802.11 and Bluetooth. In some embodiments an access point 1000 includes a main housing 102 including an outer shell and an inner cover 106. The main housing is also sometimes referred to as a main body. The access point also includes a front housing 104 which is connected to the main housing 102 by a hinge 108. The front housing 104 is held at 90 degrees in some embodiments to the main housing 102 by a bracket 117 that controls how far the front housing 104 can swing down from the main housing 102 when in the open position. On some embodiments such as the one shown in FIG. 2, a waterproof tube 255 is used as a passageway between the main housing 102 which includes main housing shell 105 and the front housing 104.

The components of the access point 1000 and their arrangement can be better understood from the various perspectives 1001, 1002, 1004, 1006, 1008 and 1010 shown in FIG. 1. In each of the FIG. 1 perspectives the access point 1000 is shown in an open position, e.g., with the front housing 104 being positioned perpendicular to the main housing 102 which includes the main housing outer shell 105. This arrangement, e.g., an open access point arrangement, is commonly used when the access point is pole mounted or mounted to a wall of a building or room. By positioning the front housing 104 in a horizontal orientation, a BLE antenna array and/or WiFi antenna in the front housing 104 are well positioned for transmitting and/or receiving wireless signals from devices positioned below the access point 1000.

View 1001 is a first side view showing the access point 1000 in an open position. View 1002 is a downward looking view showing the top of the main housing and the inside cover 132 of the front housing 104. View 1004 is a front view with inside cover 106 of the main housing being visible. View 1006 is an upward facing view showing what might be seen by looking up when the access point 1000 is mounted to a wall or pole and the access point is in the open position. Note that in this position one or more status indicators 206 which may be and sometimes are implemented as LEDs can be observed from the ground when the access point is mounted at a height which is normally above a person's head, e.g., 8 feet, 10 feet or more above the ground. Plugs 300, 301 and 302 which can be removed for connecting to conduit or for other reasons, e.g., to allow for the supply of power to the access point, are visible in view 1006. View 1008 is a perspective view of the open access point 1000. View 1010 is a second side view of the access point 1000.

The main housing 102 and front housing 104 are water tight enclosures in outdoor embodiments. In the case of indoor embodiments the access point 1000 can use the same or similar housing to that of the outdoor embodiment but the main and front housing 102, 104 need not be water tight in the case of indoor applications. In the case of an indoor embodiment the flexible watertight tube 255 shown in FIG. 2 for protecting wireless extending from the main housing 102 to the components in the front housing 104 can be omitted.

Figure 6:
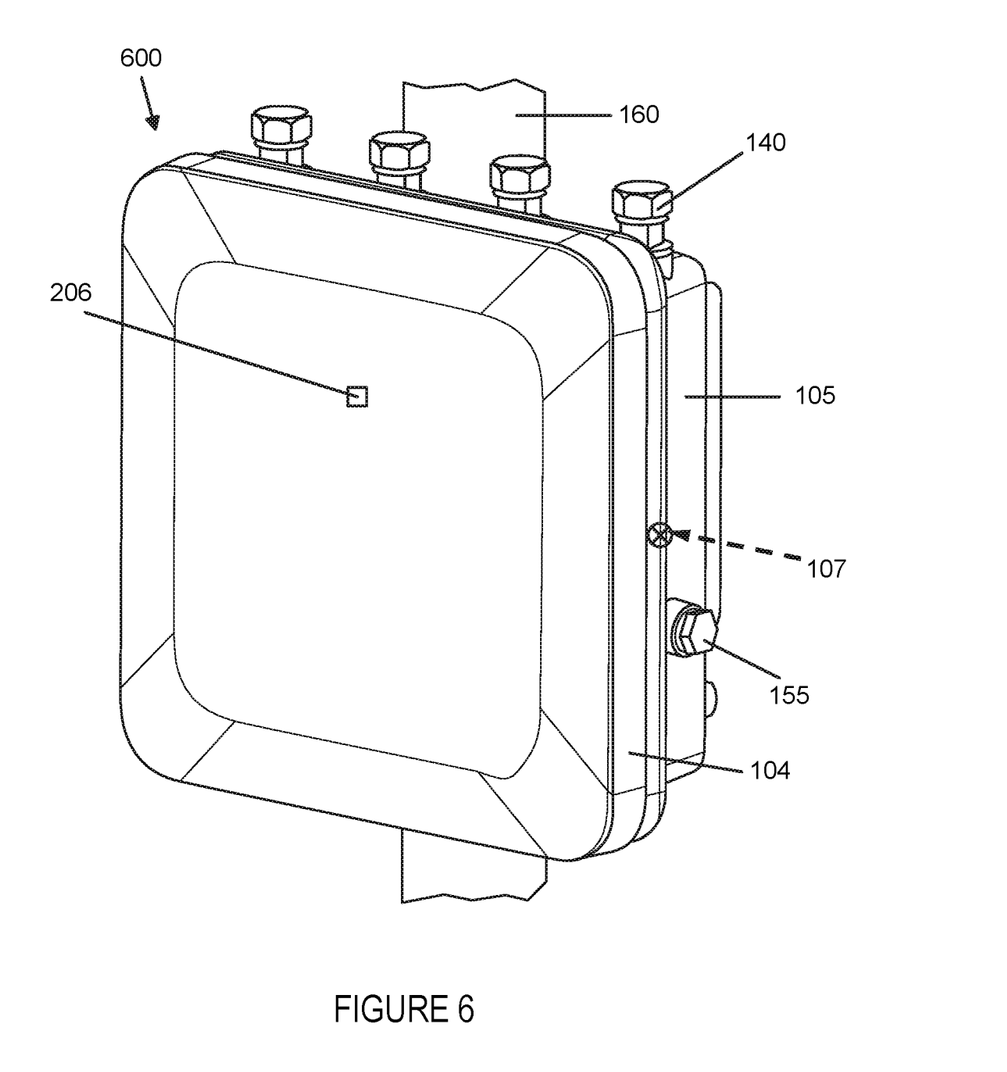
FIG. 6 shows an exemplary access point which is the same or similar to the one shown in FIG. 5 but with a fastener that can be used to secure the front housing to the main housing allowing the access point to be kept, e.g., secured by the fastener, in a closed position.

Depending on the embodiment a Wi-Fi antenna is either included in the front housing 104 or an external Wi-Fi antenna can be coupled to the AP via a waterproof antenna connector located in the top of the main housing 102 in some embodiments. The main housing 102 is formed of an outer shell 105 and an inner cover 106. The inner cover 106 can be inserted into and secured to the outer cover 105 via screws 110. In various embodiments the inner cover 106 of the main housing includes cooling fins 120' which like the cooling fins 120 of the main housing shell 105 radiate heat and facilitate the circulation of air. Given the presence of cooling fins 120, 120' air flow over both sides of the main housing 102 in which heat generating components are positioned regardless of the mounting arrangement and whether or not the access point is used in an open or closed position. An optional gasket can be and sometimes is placed between the outer shell 105 and inner cover 106 to make the main housing water tight. The outer cover 105 includes a plurality of cooling fins 120 on the outside surface of the outer cover 105 arranged so that they are in a vertical position when the access point 100 is mounted to a wall or pole as illustrated in FIG. 6. The inner cover 106 also includes a plurality of cooling fins 120' which are arranged so that the fins are in a vertical position when the access point is mounted to a wall or pole.

The fins 120 serve as a spacer to keep the internal components of the access point off a wall when they are mounted to a wall and to allow for air flow through the fins for cooling even when the access point 100 is mounted directly to a wall. The fins also serve as a heat radiating element providing more cooling surface area for heat transfer than would be available if a flat surface was used for the outer shell 105 of the main housing 102. The additional fins 120' on the inside cover 106 of the main body 102 act as a spacer between the surface of the inner cover 106 and the front housing when the access point 100 is used in a closed position. In this way the main housing 102 will have air flow on both sides through the fins 120 and/or 120' by natural convection when the access point 1000 is mounted whether the front housing 104 is in an up, e.g., closed, position or down, e.g., open position.

The front housing 104 includes outer shell 130 and an inner cover 132 which are secured together by screws 136. A gasket maybe and sometimes is used between the inner cover 132 and the outer shell 130 of the front housing 104 to form a water tight enclosure. An external Wi-Fi antenna maybe and sometimes is attached through a watertight connector 140 included at the top of the main housing 102. A pressure release value 155 is included in some embodiments to allow for automatic venting of the main body 102 in the event of changes in atmospheric pressure or changes in pressure due to changes in height of the access point as it is installed on a poll or another support structure such as the wall of an outside wall of building or room in a building.

Figure 4:
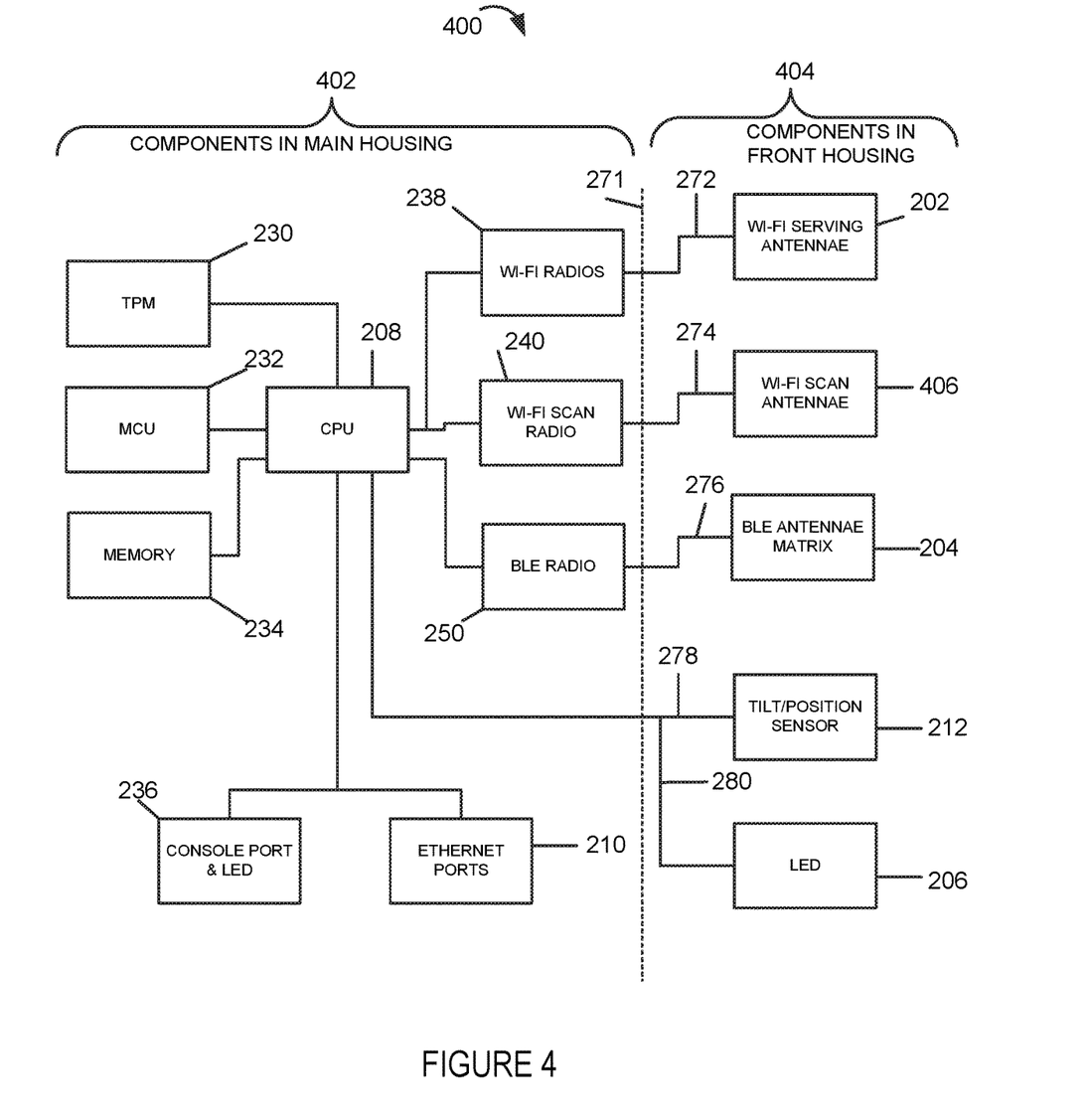
FIG. 4 shows a set of components which may be, and sometimes are, included in the main housing and front housings of the exemplary access points shown in the other figures of the application.
Figure 5:
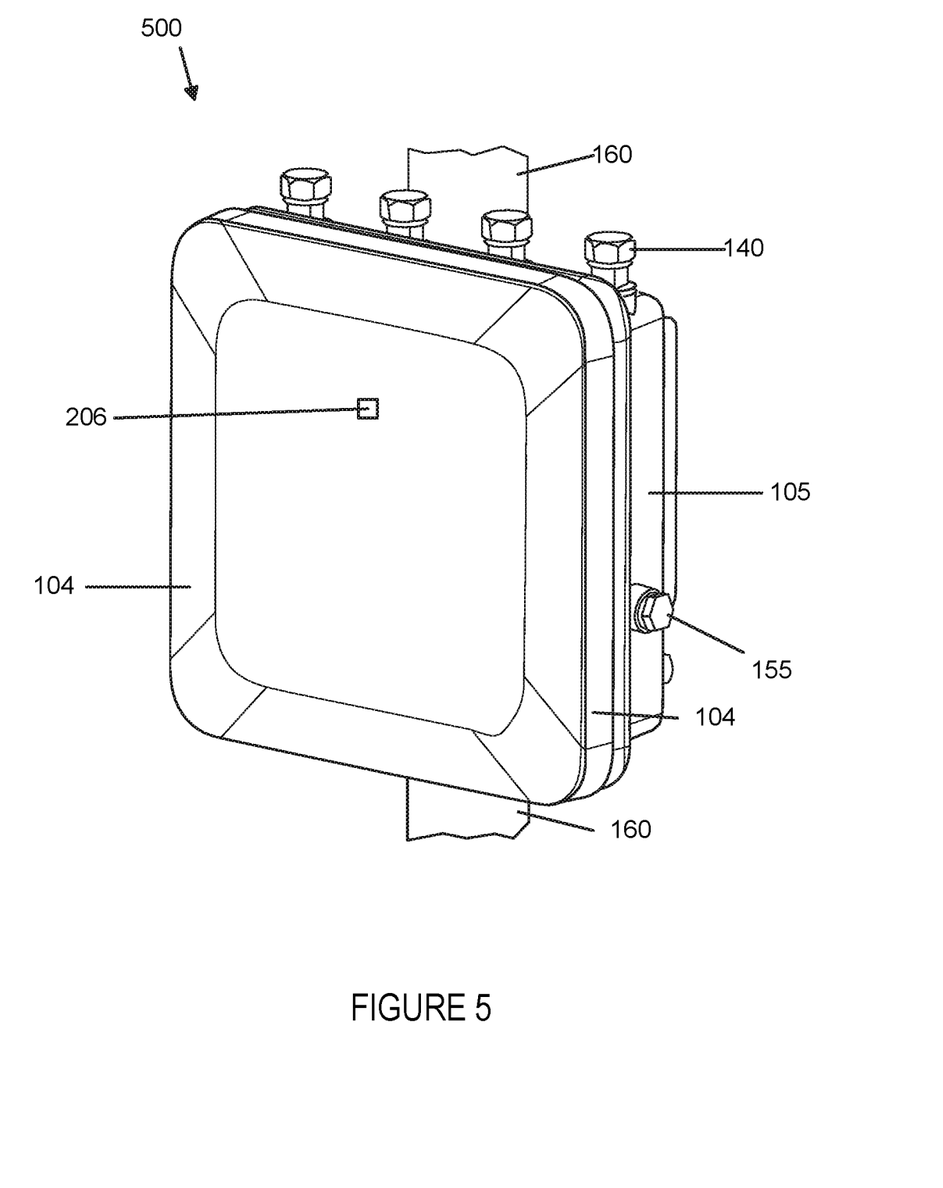
FIG. 5 shows an exemplary access point such as the one shown in FIG. 1, 2 or 3 mounted to a poll.

An external Wi-Fi antenna maybe and sometimes is attached through a watertight connector 140 included at the top of the main housing 102 which can be mounted to a pole 160 or wall is see, e.g., FIGS. 5 and 6 showing pole mounting. As illustrated in FIG. 4, alternatively an internal Wi-Fi antenna 202 included in the front housing 104 can be used to support Wi-Fi. A Bluetooth antenna assembly 204, e.g., a BLE array or matrix, is included in the moveable front housing 104 with one or more LED status indicators 206 being mounted in the front housing 104 and visible from the outside of the front housing 104. The LED status indicator(s) can and sometimes do indicate that the access point is active, e.g., powered on. The flashing of the indicator can be used to communicate various status conditions. While one LED indicator 206 is shown in FIG. 1 and various other figures, additional indicator lights may be and sometimes are included and used to communicate particular status information such as Wi-Fi status active, Bluetooth status active, in addition to general power on which maybe and sometimes is indicated by a third LED. The front housing assembly 104 is secured to the main housing by one or more hinges located 108, in some embodiments, at the bottom of the main and front housings 102, 104.

Power can be supplied to the access point 1000 by removing one of the plugs 302 and running a power line from an electrical conduit screwed into the threaded opening where the plug 300, 301 or 302 was located and connecting the power line to the components in the main body to supply power there to.

Power and data connections between the components in the main housing 102 and front housing 104 are provided via a secure waterproof cable connection, e.g., passing through a watertight tube 255 between the main and front housings, to allow the components in the main and front housings to interact.

Figure 2:
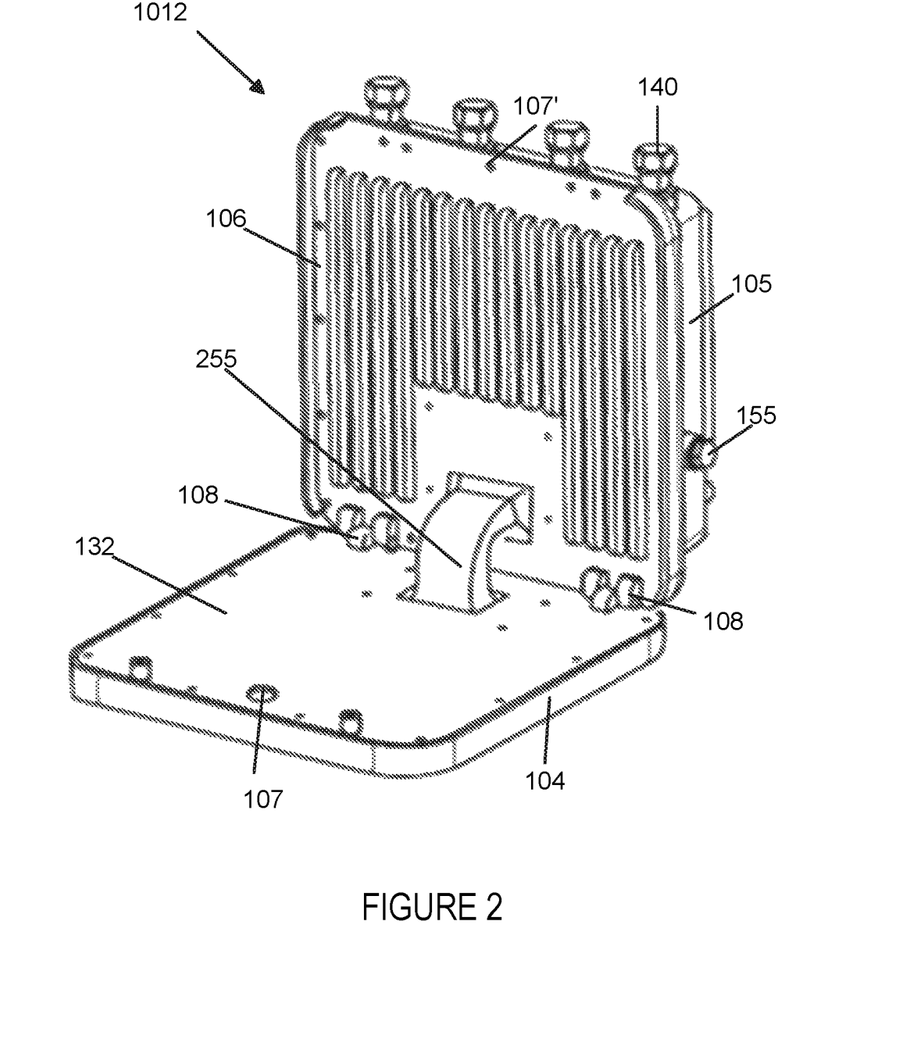
FIG. 2 is a enlarged view 1012 of an exemplary access point 1000 of FIG. 1 implemented in accordance with the invention but with a water tight tube 255 being used to form a water tight flexible passage from the inside of the main housing 102 to the inside of the front housing 104 through which wires pass. An external Wi-Fi antenna maybe and sometimes is attached through watertight connector 140 included at the top of the main housing 102.

FIG. 2 shows a perspective view 1012 of one exemplary embodiment of the access point 1000 of FIG. 1 with a watertight tube 255 being used to protect wires extending between the main housing 102 and front housing 104. In the FIG. 2 example a faster 107, which can be a snap, screw or other type of fastener, and which can be inserted or snapped into fastener receiver 107' is visible. The location of fastener 107 and fastener receiver 107' can vary depending on the embodiment. In the case where the fastener 107 is a screw the fastener receiver 107' maybe a threaded hole.

Figure 3:
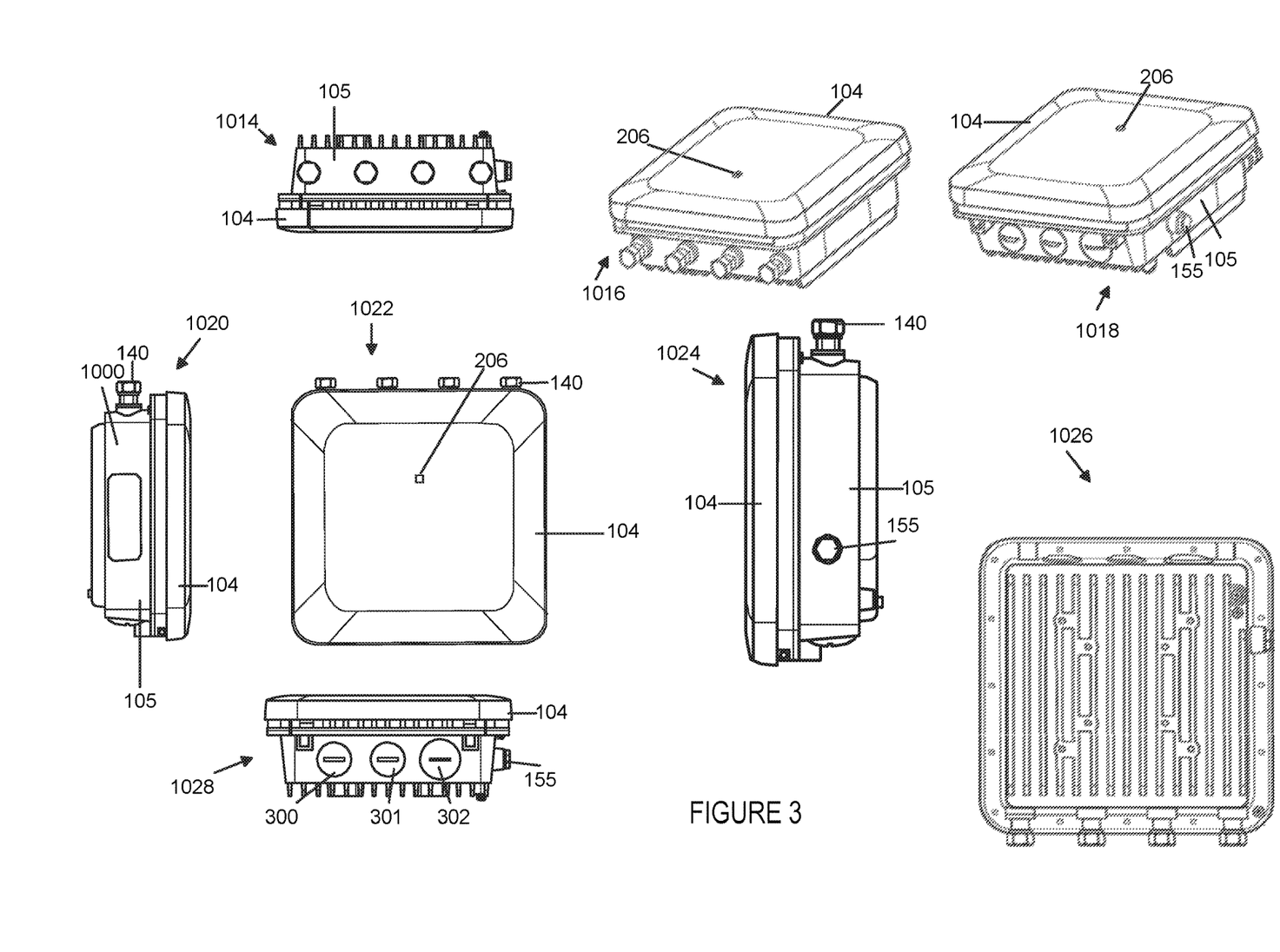
FIG. 3 is a set of diagrams showing various perspectives of the exemplary access point shown in FIG. 1 in a closed position.

FIG. 3 is a set of diagrams showing various perspectives 1014, 1016, 1018, 1020, 1022, 1024, 1026, 1028 of the exemplary access point 1000 shown in FIG. 1 and various other figures in a closed position. The various numbered components shown in FIG. 3 have already been discussed with regard to FIG. 1 and thus will not be discussed again with regard to FIG. 3.

FIG. 4, is a block diagram 400 showing he components 402 included in the main housing 104 and the components 404 included in the front housing 102 of the access point 1000 shown in FIG. 1 and the other figures. As previously discussed wires, e.g., of one or more buses, connect the components in the main 102 and front housing 104. The wires 272, 274, 276, 278 and/or 280 can and sometimes do pass through the waterproof tube 255 shown in FIG. 2. The dashed line 271 represents the connection between components in the main housing 102 and front housing 104, e.g., via the tube 255. In some embodiments the components 402 included in the main body are mounted on a printed circuit board. The components 402 in the main body 102 include a trusted platform module (TPM) 230, master control unit (MCU) 232, memory 234, central processing unit (CPU)

208, Wi-Fi radio or radios 238, a Wi-Fi scan radio 240, a BLE radio 250, console ports and LEDs 236 and Ethernet ports 210. In various embodiments, the CPU, WiFi radios and BLE radio are mounted in a watertight cavity of the main body 102 where the cavity is formed by a void between the outer shell 105 and cover 106. The pressure vent 155 vents the cavity to the outside environment thereby avoiding pressure build up in the cavity and/or pressure equalization between the cavity and an environment in which the access point 1000 is located, e.g., mounted.

Figure 7:
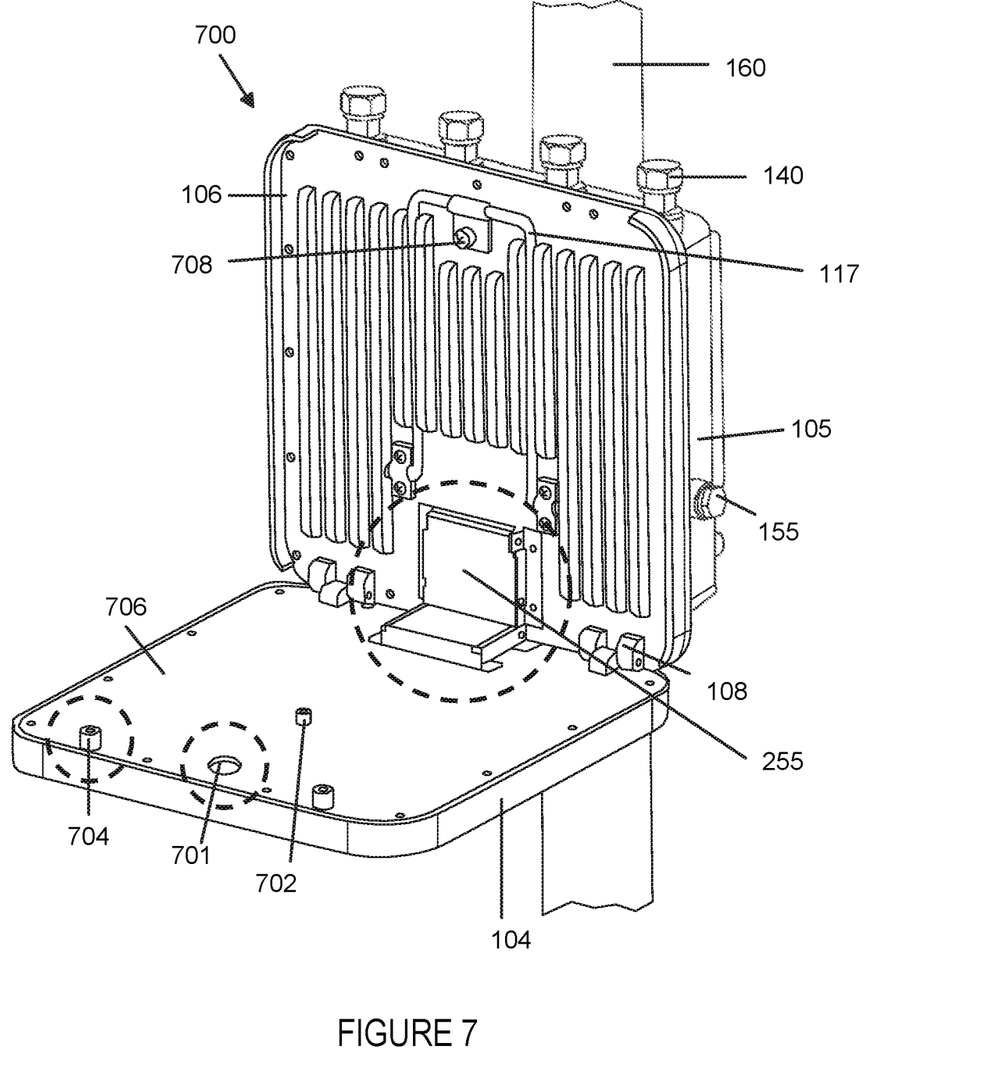
FIG. 7 shows various features of an access point implemented in accordance with the invention which are visible when the access point is in an open position with the front housing being deployed to be in a horizontal position while the main housing is arranged vertically and secured to a pole.

The TPM 230 is a chip that stores encryption keys, e.g., RSA encryption keys, specific to the access point for hardware authentication. The CPU 208 and/or MCU 232 control the access point to receive and transmit signals, e.g., WIFI and/or BLE signals and to communicate information, e.g., via an Ethernet port 210 to/from a network device and/or the Internet. The components 402 inside the main housing 102 are coupled to the components 404 in the front housing 104 via cables or ports which extend through the main housing 102 in a manner that allows for a watertight seal in at least some embodiments. The components 404 in the front housing 104 include antennas 202, 204, 406 and/or other components such as tilt sensor 212 and LED or LEDs 206 which provide a status indication. In some embodiments a water tight tube or enclosure 255 as illustrated in FIGS. 2 and 7, is used to protect cables 272, 274, 276, 278, 280 as they pass from the main body 102 including outer shell 105, to the front housing 104. Tube/enclosure 255 is used to form a water tight flexible passage from the inside of the main housing 102 to the inside of the front housing 104 while the cooling fins 120 on the main body 102 and cooling fins 120' on the cover 106 allow the components included in the compartment formed by the main body 102 and cover 106 to dissipate heat.

The access point 1000 of FIG. 1 and the other Figures can be wall or pole mounted. FIGS. 5 and 6 include diagrams 500, 600, respectively, showing exemplary access points mounted to a pole 160. The mounted access points can be the same or similar to the access points shown in any of the other figures. Note that in the FIG. 6 example a screw, snap or other fastener 117 is positioned on the side rather than on the top of the access point and can be used to secure the access point front housing 104 in a closed position.

FIG. 7 is a diagram 700 showing an exemplary access point which maybe the same or similar to the access point shown in any of the other figures in a open position with a retaining bracket 117 being shown and the waterproof cover 255 also being shown. In the FIG. 7 example a screw 708 is used to hold the bracket 117 in a position in which the bracket is secured when the access point shown in FIG. 7 is in the closed position. Note that recess 701 prevents the head of the screw 708 interfering with the front housing 104 when the access point is in the closed position. When setting the access point front cover 104 into the horizontal position, screw 708 will be removed and used to secure the bracket 117 to the front cover by screwing the screw 708 into threaded shaft/hole 702. Note that in FIG. 7 the inside cover 706 of the front housing 104 includes standoffs 704 to maintain proper spacing between the inside cover 704 of the front housing and the inside cover 106 of the main body 102 which includes outer shell 105.

Figure 8:
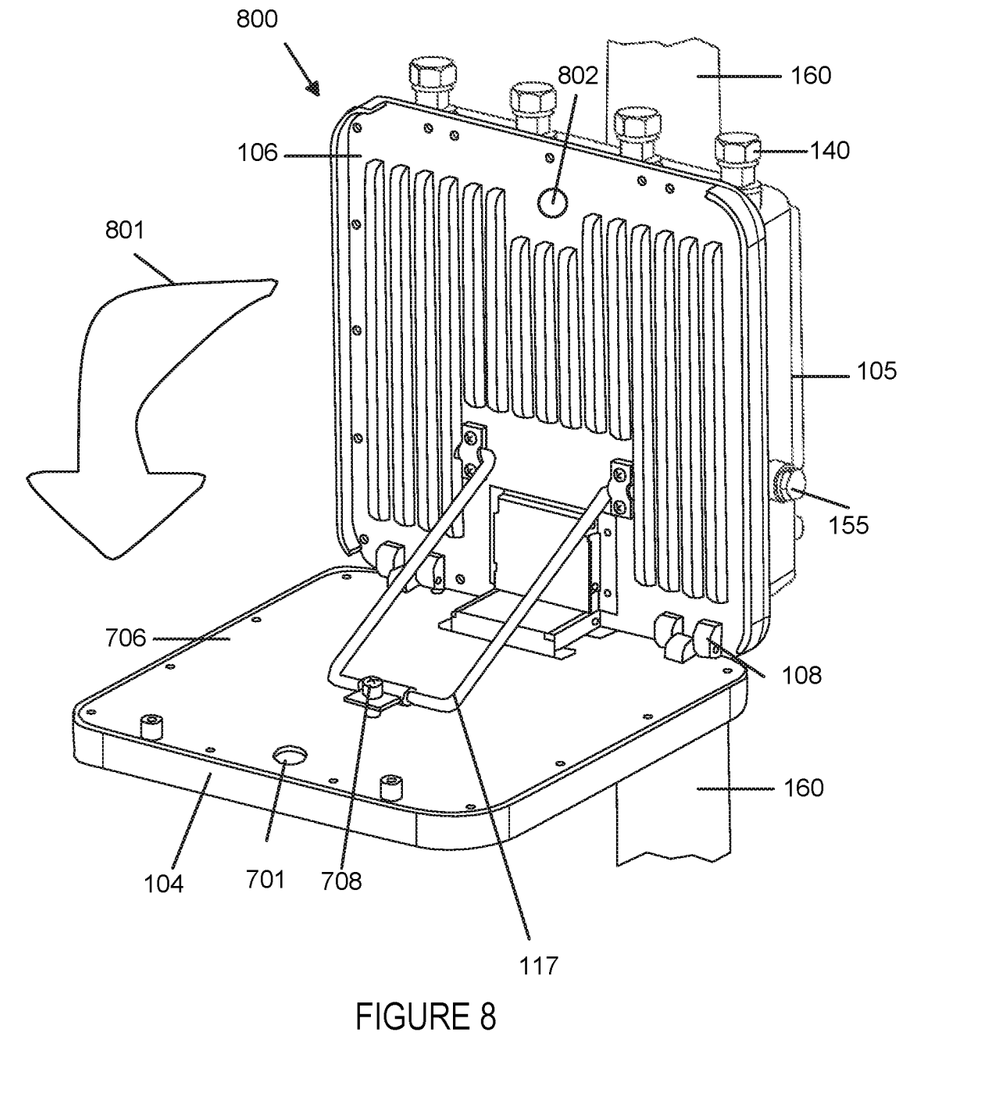
FIG. 8 shows how a bracket can be used to hold the front housing of an access point such as the one shown in FIG. 7 or the other figures, in a horizontal position when the access point is open and the main housing is mounted to a pole with the bracket limiting the amount of downward travel of the front housing.

Referring now to FIG. 8, a diagram 800 shows the exemplary access point of FIG. 7 with the bracket 117 deployed to maintain the front housing 104 in a horizontal position. Arrow 801 represents the fact that as part of deploying the front housing 104 into the horizontal position the cover will be hinged outward from the upright closed position to the horizontal position shown in FIG. 8.

Figure 11:
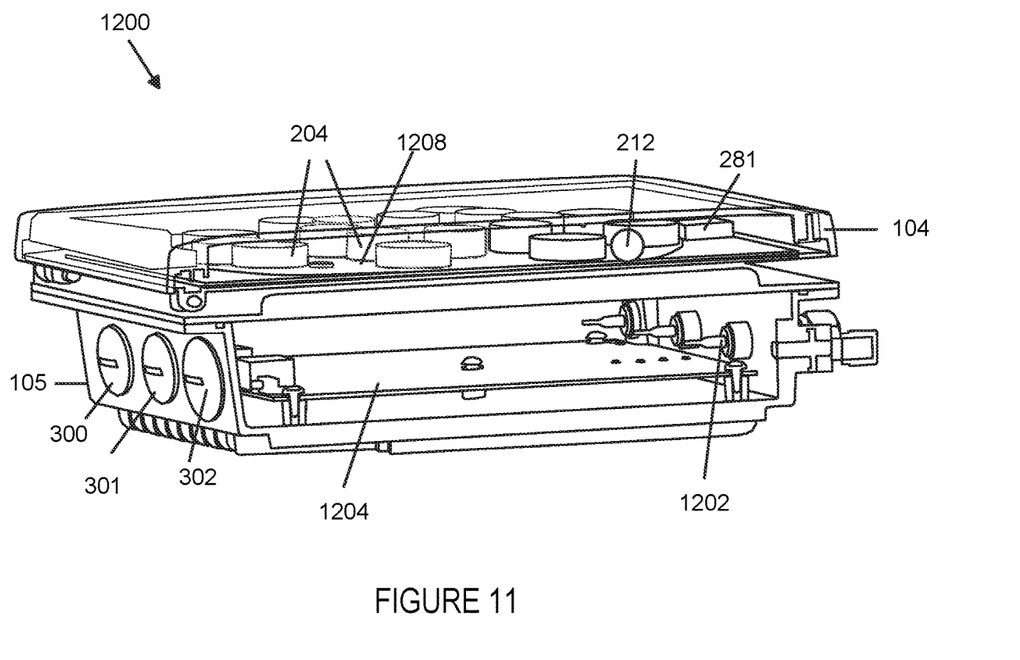
FIG. 11 is a side cut away view of an exemplary access point, such as the access point of any of the other figures, in which the antenna array in the front housing can be seen and various other components in the main housing can be seen.

FIG. 11 is a side cut away view of an exemplary access point, such as the access point of any of the other figures, in which the antenna array in the front housing can be seen and various other components in the main housing can be seen.

Figure 12:
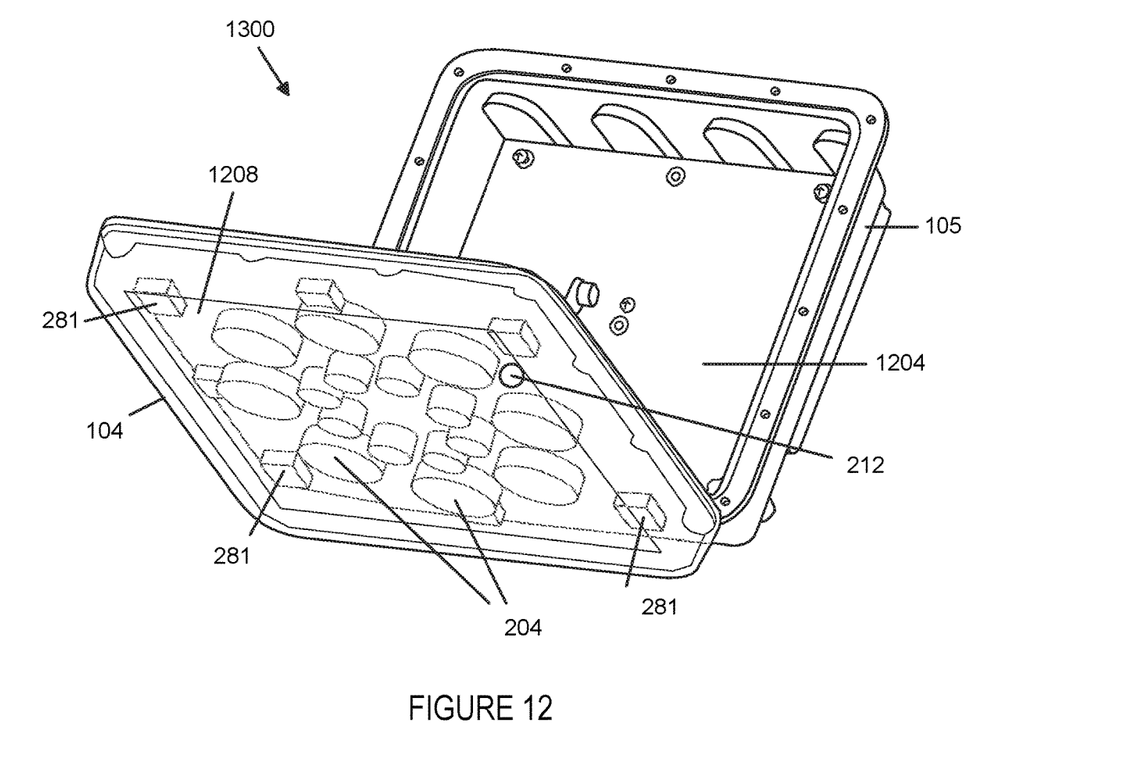
FIG. 12 is a view of an exemplary access point, such as the access point of any of the other figures, with the front cover being shown as transparent allowing the antenna array and other elements in the front housing to be seen.

FIG. 12 is a view of an exemplary access point, such as the access point of any of the other figures, with the front cover being shown as transparent allowing the antenna array and other elements in the front housing to be seen.

The main front housing, as shown in FIG. 11, includes the Bluetooth antenna assembly, includes one or more antenna elements used to transmit and/or receive Bluetooth signals, e.g., BLE signals, and can be used in a vertical or horizontal position. The position of the front housing 104 is detected and reported to a processor in the access point 208 and, optionally, one or more devices coupled to the access point by an interface e.g., Ethernet Ports 210 and/or Wi-Fi signals. The position is detected by a sensor 212 or sensor array located in the front housing 104. The sensors 212 may and sometimes do include one or more accelerometers. The detected position of the Bluetooth and/or included Wi-Fi antenna is known from the reported housing position information, e.g., relative to the ground, with the positions being detected by sensors in the access point and communicated to one or more devices which use the access point or process measurements of signals received from the access point. The height from the ground and/or GPS determined location maybe determined and reported by sensors 212 in addition to the tilt or angle of the front housing 104. Thus from the angle of the housing 104 the orientation or angle to the ground maybe known while GPS or other sensor information may provide the height and location of the access point 100 in the environment. The front housing tilt information provides Bluetooth and/or Wi-Fi antenna position orientation information, e.g., vertical, horizontal or at some angle relative to horizontal, which is useful in understanding the radiation pattern which will be generated by the access point 100. Such information can be important in facilitating position determinations made from signals received from the access point since the RF coverage and/or path loss for signals transmitted by the access point can be estimated taking into consideration the position of the antenna(s) relative to the ground.

Figure 9:
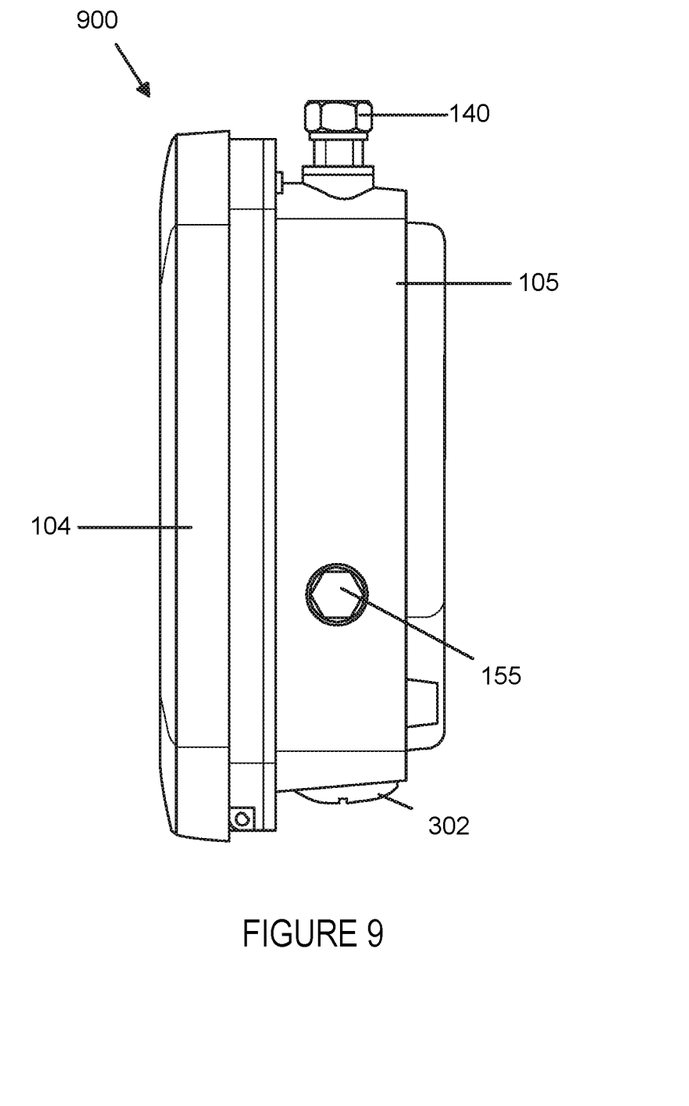
FIG. 9 is a side view of an exemplary outdoor access point implemented in accordance with the invention with the access point being in a closed position.

FIG. 9 shows a side view 900 of an exemplary outdoor access point, which is the same or similar to the access point of FIG. 1 or the other figures.

Figure 10:
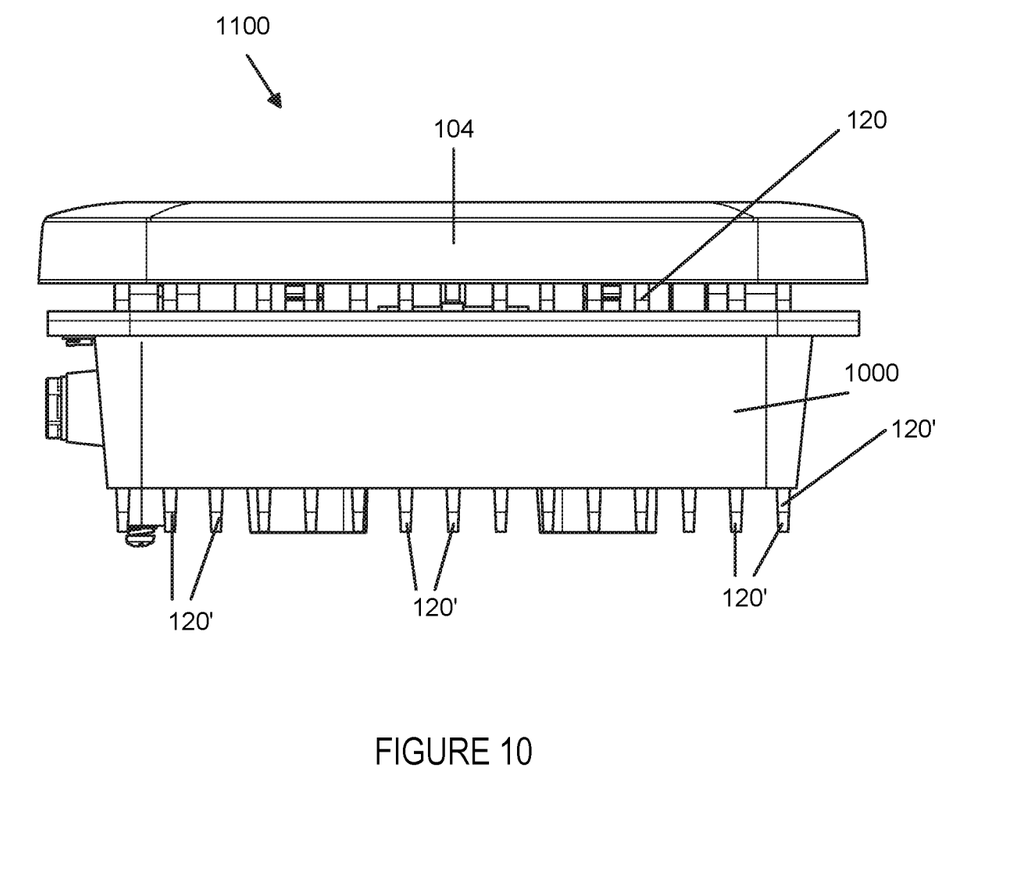
FIG. 10 is upward facing view of an access point of the present invention where the bottom of the access point can be seen along with the fins which allow air to pass up through the access point cooling both the front and rear surfaces of the main housing in which the central processing unit and various other heat generating components of the access point are located.

FIG. 10 is upward facing view 1100 of an access point which is the same or similar to the access point of the other figures. The bottom of the access point can be seen along with the fins 120, 120' which allow air to pass up through the access point 1000 cooling both the front and rear surfaces of the main housing in which the central processing unit and various other heat generating components of the access point are located.

The FIG. 10 is an internal antenna version of a closed outdoor access point 1000 which has cooling fins between the front and main housing portions allows air to pass through the device and cool both the main and front assemblies. Water tight connectors allow for the supply of power and antenna connections 140. Cooling fins on the back of the main housing 102 which maybe be secured against a wall allow for air to pass between the wall and main access point housing even when secured directly to a wall. Thus air can flow around each side of the main and front housing in both wall and poll deployments since the arrangement of cooling fins allow for air flow between and behind the front housing 104 and main housing 102. Air can also pass along the front of the front body since it is normally exposed in either the open or closed positions access point modes of operation. A pressure vent 155 is included to allow venting in the case of pressure build up, e.g., due to heating, without letting water in.

FIG. 11 is a side cut away view 1200 of an exemplary access point which can be the same or similar to the access point 1000 shown in FIG. 1 or any of the other figures. In FIG. 11 the antenna elements of the BLE antenna array 204 are represented by discs included in the front housing 104. WiFi antennas are represented by rectangular blocks 281. Also visible is mounting board 1208, e.g., a printed circuit or other rigid board, to which the antenna elements 204, 281 are mounted. In the FIG. 11 example the front housing 104 also includes a position sensor 212. While WiFi antenna elements are present an external WiFi antenna can be connected to antenna terminals 1202 and used instead of the internal WiFi antenna elements 281. Board 1204 represents a rigid board to which the components 402 in the main housing including the CPU 208 can be and sometimes are secured.

FIG. 12 is a view 1300 of an exemplary access point, such as the access point 1000 of any of the other figures, with the front cover being shown as transparent allowing the BLE antenna array 204, WiFi antennas 281, tilt sensor 212 and other elements in the front housing to be seen. The Bluetooth antenna array 204 as shown in FIG. 12 can be used in the vertical or horizontal front assembly positions with knowledge of the position being known from the position sensor 212 allowing the orientation of the front housing 104 and thus the components included such as antennas 204, 281 to be taken into consideration when making WiFi coverage and/or Bluetooth coverage area predictions that can be used, e.g., to facilitate location determination.

While in various embodiments the main housing 102 is connected to the front housing 104 via a hinge 108, it should be appreciated however that the hinge 108 could be, and in some embodiments is, secured to the inner cover 106 which would still allow the front portion 104 to move relative to the components in the main body 102.

In some embodiments a screw, clip or other reusable fastener 107 is used to secure the front housing 104 in a closed position against the main body when the access point 100 is used in a closed position. The fastener 107 is located at the top center of the outside cover and secures the cover to the main body 102 or inners cover 106. The clip 107 can be snapped or unsnapped by pressing the outer housing 104 against the main body 102 or pulling on the other housing 104 to move the outer housing 104 to the open position. A receiver portion 107' of the clip 107 maybe and sometimes is included on the main body 102 or inner cover 106 at a location where it will contact the clip 107.

NUMBERED LIST OF EXEMPLARY APPARATUS EMBODIMENTS

Numbered Embodiment 1

An access point comprising a main housing (102) including cooling fins (120), a first cover (106) including cooling fins (120') sealing said main housing (102); and a moveable front housing (104).

Numbered Embodiment 2

The access point of numbered embodiment 1, wherein said moveable front housing (104) is coupled to the main housing (102) or said inner cover (106) by a hinge (108).

Numbered Embodiment 3

The access point of numbered embodiment 1, wherein said access point includes: a central processing unit (208) and at least one radio (238 or 240) mounted in said main housing (102).

Numbered Embodiment 4

The access point of numbered embodiment 3, wherein said main housing includes: a memory (234); and an Ethernet port (210).

Numbered Embodiment 5

The access point of numbered embodiment 4, further comprising: a least one LED (236) included in the main housing, said at least one LED (236) being visible from the outside of said main housing (102) and indicating a status condition of said access point.

Numbered Embodiment 6

The access point of numbered embodiment 1, further comprising: a first antenna element (element of array 204 or 281) positioned inside said front housing (104).

Numbered Embodiment 7

The access point of numbered embodiment 6, further comprising: a tilt or position sensor (212) mounted in said front housing (104) for determining the orientation of said front housing.

Numbered Embodiment 8

The access point of numbered embodiment 6, wherein at least one antenna (204) is part of a BLE antenna matrix.

Numbered Embodiment 9

The access point of numbered embodiment 8, further comprising: a Wi-Fi antenna (281) mounted in said front housing (104).

Numbered Embodiment 10

The access point of numbered embodiment 9, further comprising: a water tight flexible tube (255) coupling the interior of the main body (102) to the interior of the front housing (104).

Numbered Embodiment 11

The access point of numbered embodiment 10, wherein the main body (102) is movably connected to the front housing (104) by a pair of hinges (108).

Numbered Embodiment 12

The access point of numbered embodiment 11, further comprising: a bracket (117), said bracket securing the front housing (104) at a position which is at most 90 degrees with respect to the main body (102) when the main body is mounted vertically on a wall or pole.

Numbered Embodiment 13

The access point of numbered embodiment 6, wherein the first antenna element (element of array 204) is part of Bluetooth Low Energy (BLE) antenna array 204; and wherein said access point further includes a second antenna element (281) positioned inside said front housing (104), said second antenna element being a WiFi antenna element (281).

Numbered Embodiment 14

The access point of numbered embodiment 3, wherein said main housing (102) includes both a Bluetooth radio and a WiFi radio.

Numbered Embodiment 15

The access point of numbered embodiment 3, further comprising: an external antenna connector (1202) for connecting the access point to an external WiFi antenna.

Numbered Embodiment 16

The access point of numbered embodiment 15, wherein said access point is a pole or wall mounted access point with said movable front housing (104) being positioned in a horizontal position relative to ground or a floor beneath the access point.

Numbered Embodiment 17

The access point of numbered embodiment 16, wherein said main body 102 of said access point is positioned in a vertical position while said moveable front housing (104) is positioned in a horizontal position.

Numbered Embodiment 18

The access point of numbered embodiment 17, further comprising: a position sensor (212) for detecting the position of said moveable front housing.

Numbered Embodiment 19

The access point of numbered embodiment 18 further comprising: a pressure vent (155) for venting pressure from the main housing (102).

Numbered Embodiment 20

The access point of numbered embodiment 19, further comprising: a flexible waterproof tube (255) through which wires pass from the main housing (102) to the front housing (104).

The techniques of various embodiments may be implemented using software, hardware and/or a combination of software and hardware. Various embodiments are also directed to non-transitory machine, e.g., computer, readable medium, e.g., ROM, RAM, CDs, hard discs, etc., which include machine readable instructions for controlling a machine to implement one or more steps of a method.

It is understood that the specific order or hierarchy of steps in the processes disclosed is an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

In various embodiments devices, e.g., access points, and nodes described herein are implemented using one or more modules to perform the steps corresponding to one or more methods, for example, signal generation, transmitting, processing, analyzing, and/or receiving steps. Thus, in some embodiments various features are implemented using modules. Such modules may be implemented using software, hardware or a combination of software and hardware. In some embodiments each module is implemented as an individual circuit with the device or system including a separate circuit for implementing the function corresponding to each described module. Many of the above described methods or method steps can be implemented using machine executable instructions, such as software, included in a machine readable medium such as a memory device, e.g., RAM, floppy disk, etc. to control a machine, e.g., general purpose computer with or without additional hardware, to implement all or portions of the above described methods, e.g., in one or more nodes. Accordingly, among other things, various embodiments are directed to a machine-readable medium e.g., a non-transitory computer readable medium, including machine executable instructions for causing a machine, e.g., processor and associated hardware, to perform one or more of the steps of the above-described method(s). Some embodiments are directed to a device including a processor configured to implement one, multiple or all of the steps of one or more methods of the invention.

In some embodiments, the processor or processors, e.g., CPUs, of one or more devices, e.g., communications devices such as network management nodes, wireless terminals (UEs), and/or access nodes, are configured to perform the steps of the methods described as being performed by the devices. The configuration of the processor may be achieved by using one or more modules, e.g., software modules, to control processor configuration and/or by including hardware in the processor, e.g., hardware modules, to perform the recited steps and/or control processor configuration. Accordingly, some but not all embodiments are directed to a communications device, e.g., user equipment, with a processor which includes a module corresponding to each of the steps of the various described methods performed by the device in which the processor is included. In some but not all embodiments a communications device includes a module corresponding to each of the steps of the various described methods performed by the device in which the processor is included. The modules may be implemented purely in hardware, e.g., as circuits, or may be implemented using software and/or hardware or a combination of software and hardware.

Some embodiments are directed to a computer program product comprising a computer-readable medium comprising code for causing a computer, or multiple computers, to implement various functions, steps, acts and/or operations, e.g. one or more steps described above. Depending on the embodiment, the computer program product can, and sometimes does, include different code for each step to be performed. Thus, the computer program product may, and sometimes does, include code for each individual step of a method, e.g., a method of operating a communications device, e.g., a network management node, an access point, a base station, a wireless terminal or node. The code may be in the form of machine, e.g., computer, executable instructions stored on a computer-readable medium such as a RAM (Random Access Memory), ROM (Read Only Memory) or other type of storage device. In addition to being directed to a computer program product, some embodiments are directed to a processor configured to implement one or more of the various functions, steps, acts and/or operations of one or more methods described above. Accordingly, some embodiments are directed to a processor, e.g., CPU, configured to implement some or all of the steps of the methods described herein. The processor may be for use in, e.g., a communications device or other device described in the present application.

While described in the context of a communications system including cellular, WiFi, Bluetooth and BLE, at least some of the methods and apparatus of various embodiments are applicable to a wide range of communications systems including many non-OFDM and/or non-cellular systems.

Numerous additional variations on the methods and apparatus of the various embodiments described above will be apparent to those skilled in the art in view of the above description. Such variations are to be considered within the scope. The methods and apparatus may be, and in various embodiments are, used with CDMA, orthogonal frequency division multiplexing (OFDM), WiFi, Bluetooth, BLE, and/or various other types of communications techniques which may be used to provide wireless communications links between access nodes and mobile nodes. In some embodiments the access nodes are implemented as base stations which establish communications links with user equipment devices, e.g., mobile nodes, using WiFi, Bluetooth, BLE, OFDM and/or CDMA. In various embodiments the mobile nodes are implemented as notebook computers, personal data assistants (PDAs), or other portable devices including receiver/transmitter circuits and logic and/or routines, for implementing the methods.

What is claimed is:

1. An access point comprising:
a main housing including cooling fins;
a first radio mounted in the main housing;
a first cover configured to seal the main housing, the first cover including cooling fins; and
a front housing, the front housing movable with respect to the main housing; and
a first antenna element mounted in the front housing, the first antenna element operably coupled to the first radio.

2. The access point of claim 1, further comprising a hinge, a first side of the hinge secured to the front housing and a second side of the hinge secured to the main housing or said first cover.

3. The access point of claim 1, wherein said access point includes:
a central processing unit (CPU);
a memory coupled to the CPU; and
an ethernet port operably coupled to the CPU.

4. The access point of claim 3, further comprising:
at least one LED included in the main housing, said at least one LED being visible from an outside of said main housing and indicating a status condition of said access point.

5. The access point of claim 1, further comprising:
a tilt or position sensor mounted in said front housing, wherein the access point is configured to communicate a position of said front housing to a second device, the position based on input from the tilt or position sensor.

6. The access point of claim 1, further comprising a Bluetooth Low Energy (BLE) antenna matrix, wherein the first antenna element is included in the BLE antenna matrix, and wherein the first radio is a Bluetooth low energy (BLE) radio.

7. The access point of claim 6, further comprising:
a Wi-Fi antenna mounted in said front housing; and
a Wi-Fi radio mounted in said main housing, the Wi-Fi radio operably connected to the Wi-Fi antenna.

8. The access point of claim 7, further comprising:
a water tight flexible tube coupling an interior of the main housing to an interior of the front housing.

9. The access point of claim 8, further comprising a second hinge, a first side of the second hinge secured to the main housing or said first cover and a second side of the second hinge secured to the front housing.

10. The access point of claim 9, further comprising
a bracket, said bracket securing the front housing at a position which is at most 90 degrees with respect to the main housing when the main housing is mounted vertically.

11. The access point of claim 1, further comprising:
a second radio, the second radio being a WiFi radio;
a second antenna element positioned inside said front housing, said second antenna element being a WiFi antenna element and being operably coupled to said second radio,
wherein the first antenna element is part of a BLE antenna array, the BLE antenna array operably coupled to the first radio.

12. The access point of claim 3, wherein said main housing includes both a Bluetooth radio and a WiFi radio.

13. The access point of claim 3, further comprising:
an external antenna connector.

14. The access point of claim 13, wherein said access point is mounted on a pole or wall, with said front housing positioned in a horizontal position relative to ground or a floor beneath the access point.

15. The access point of claim 14, wherein said main housing is positioned in a vertical position while said front housing is positioned in a horizontal position.

16. The access point of claim 15, further comprising:
a position sensor for detecting the horizontal position of said front housing.

17. The access point of claim 16 further comprising:
a pressure vent for venting pressure from the main housing.

18. The access point of claim 17, further comprising:
a flexible waterproof tube through which wires pass from the main housing to the front housing.

* * * * *

UNITED STATES PATENT AND TRADEMARK OFFICE
CERTIFICATE OF CORRECTION

| | |
|---|---|
| PATENT NO. | : 10,879,584 B2 |
| APPLICATION NO. | : 16/403544 |
| DATED | : December 29, 2020 |
| INVENTOR(S) | : Joshua Rosenthal and John James Musante |

It is certified that error appears in the above-identified patent and that said Letters Patent is hereby corrected as shown below:

On the Title Page

Item (71) Replace: "Mist Systems, Inc., Cupertino, CA (US)" with --Juniper Networks, Inc., Sunnyvale, CA (US)--

Item (72) Replace: "Inventor: Josh Rosenthal, San Jose, CA (US), John Musante, Holtsville, NY (US)" with --Inventor: Joshua Rosenthal, San Jose, CA (US), John James Musante, Holtsville, NY (US)--

Signed and Sealed this
Seventh Day of June, 2022

*Katherine Kelly Vidal*

Katherine Kelly Vidal
*Director of the United States Patent and Trademark Office*